US012618900B2

(12) United States Patent
　　Tong et al.

(10) Patent No.: US 12,618,900 B2
(45) Date of Patent: May 5, 2026

(54) WAFER LEVEL ELECTRON BEAM PROBER

(71) Applicant: Intel Corporation, Santa Clara, CA (US)

(72) Inventors: Xianghong Tong, Hillsboro, OR (US); Martin Von Haartman, Portland, OR (US); Zhiyong Ma, Hillsboro, OR (US); Jennifer J. Huening, Hillsboro, OR (US); Hyuk Ju Ryu, Hillsboro, OR (US); Christopher Morgan, Portland, OR (US); Shuai Zhao, Beaverton, OR (US); Ramune Nagisetty, Portland, OR (US); Tuyen K. Tran, Portland, OR (US); Wen-Hsien Chuang, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 229 days.

(21) Appl. No.: 17/701,323

(22) Filed: Mar. 22, 2022

(65) Prior Publication Data

US 2023/0305057 A1　　Sep. 28, 2023

(51) Int. Cl.
| | |
|---|---|
| *G01R 31/307* | (2006.01) |
| *G01R 1/02* | (2006.01) |
| *G01R 1/04* | (2006.01) |
| *G01R 1/067* | (2006.01) |
| *G01R 1/073* | (2006.01) |
| *G01R 31/26* | (2020.01) |
| *G01R 31/305* | (2006.01) |
| *G01R 31/311* | (2006.01) |

(52) U.S. Cl.
CPC ....... *G01R 31/307* (2013.01); *G01R 1/07342* (2013.01)

(58) Field of Classification Search
CPC .... G01R 31/26; G01R 31/302; G01R 31/305; G01R 31/307; G01R 31/311; G01R 1/02; G01R 1/04; G01R 1/067; G01R 1/073
See application file for complete search history.

(56) References Cited

U.S. PATENT DOCUMENTS

| | | | | | |
|---|---|---|---|---|---|
| 5,478,698 | A | * | 12/1995 | Rostoker | ................ B82Y 10/00 |
| | | | | | 430/311 |
| 6,621,288 | B1 | * | 9/2003 | Bruce | .................. G01R 31/307 |
| | | | | | 324/501 |
| 10,068,747 | B2 | * | 9/2018 | Budach | .................. H01J 37/222 |
| 2003/0016153 | A1 | * | 1/2003 | Wang | ................... G01R 31/305 |
| | | | | | 341/155 |
| 2007/0040118 | A1 | * | 2/2007 | Cheng | ................ G01N 23/2251 |
| | | | | | 250/310 |

FOREIGN PATENT DOCUMENTS

WO　　　　2019066802　　　4/2019

* cited by examiner

*Primary Examiner* — Neel D Shah
(74) *Attorney, Agent, or Firm* — Essential Patents Group, LLP

(57)　　　　ABSTRACT

Wafer level electron beam prober systems, devices, and techniques, are described herein related to providing wafer level testing for fabricated device structures. Such wafer level testing contacts a first side of a die of a wafer with a probe to provide test signals to the die under test and performs e-beam imaging of the first side of the die while the test signals are provided to the die under test.

23 Claims, 8 Drawing Sheets

600

601 — Process Change

602 — Wafer Fabrication

603 — Inline E-Beam Testing

604 — Transmission Electron Microscopy / Physical Failure Analysis

D1

D2

Feedback to Process Module — 605

700

Parallel to Gate 791          Orthogonal to Gate 792

M4
V3
M3
V2
M2
V1
M1
V0

731

742

702    707    712    702    705    703    781    741

707    704 706    734    708

712

Z
X

Z
Y

800

| Receive Wafer for E-Beam Probing | — 801 |

| Position Die for E-Beam Probing | — 802 |

| Couple Probe to Die | — 803 |

| Provide / Receive Test Signal to / from Die | — 804 |

| Emit E-Beam During Test Signal | — 805 |

808

| Detect E-Beam Signal | — 806 |

| Generate Test Data | — 807 |

Central Processor 901

Beam Controller 521

Detected Signal Analyzer 522

Probe Signal Controller 523

Stage Controller 524

Image Processor 902

Memory 903

System 900

WAFER LEVEL ELECTRON BEAM PROBER

BACKGROUND

Fault isolation and failure analysis are critical parts of product design validation and debug, process development, production yield improvement, reliability testing, product certification, and product reliability qualification. The ability to identify and isolate the failing circuits and devices often defines the success or failure of a product launch. Current fault isolation at end of line is achieved by packaging units post end of line, processing and sort testing, and subsequent use of optical tools such as laser assisted device alternation, thermal induced voltage alteration, laser voltage probe/laser timing probe to locate failing devices or circuits. For example, test structures designed for offline nano- or pico-probing (i.e., extracting device electrical parameters using nano- or pico-scale probe wires) in coupon form for defect detection require breaking the structure off the wafer and loading into a nano-prober for fault isolation.

Such end of line processing has a very long learning cycle for the yield and performance impact of any process skew or change due to the wait until the wafer has completed all the process, through sort tests, and build of the failing units for the optical testing to conduct debug and fault isolation. Furthermore, more advanced device structures such as double-sided metal interconnect devices cannot be analyzed using optical methods due to the blockage of the signals from both the front side and the back side of the chip. Such techniques are also susceptible to wafer depletion by pulling wafers offline for fault analysis before end of line, which reduces data turn and the ability to match to end of line data, limited ability to analyze in-line wafers, low resolution of optical techniques, lack of capability for localized quantitative circuit parameter measurement, and others. For example, the resolution of the optical approach is limited by the optical system resolution in infrared range where silicon is transparent as the signal needs to go through the silicon to reach the devices or come from the device to reach the imaging system, with current resolutions limited to about 240 nm using a 3.0 numerical aperture solid immersion lens. In addition to such limitations with resolution, other difficulties persist.

It is with respect to these and other considerations that the present improvements have been needed. Thus, improvements are needed in the area of apparatuses and methodologies for performing chip debug, fault isolation, and similar operations.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements. In the figures.

DETAILED DESCRIPTION

Figure 1:
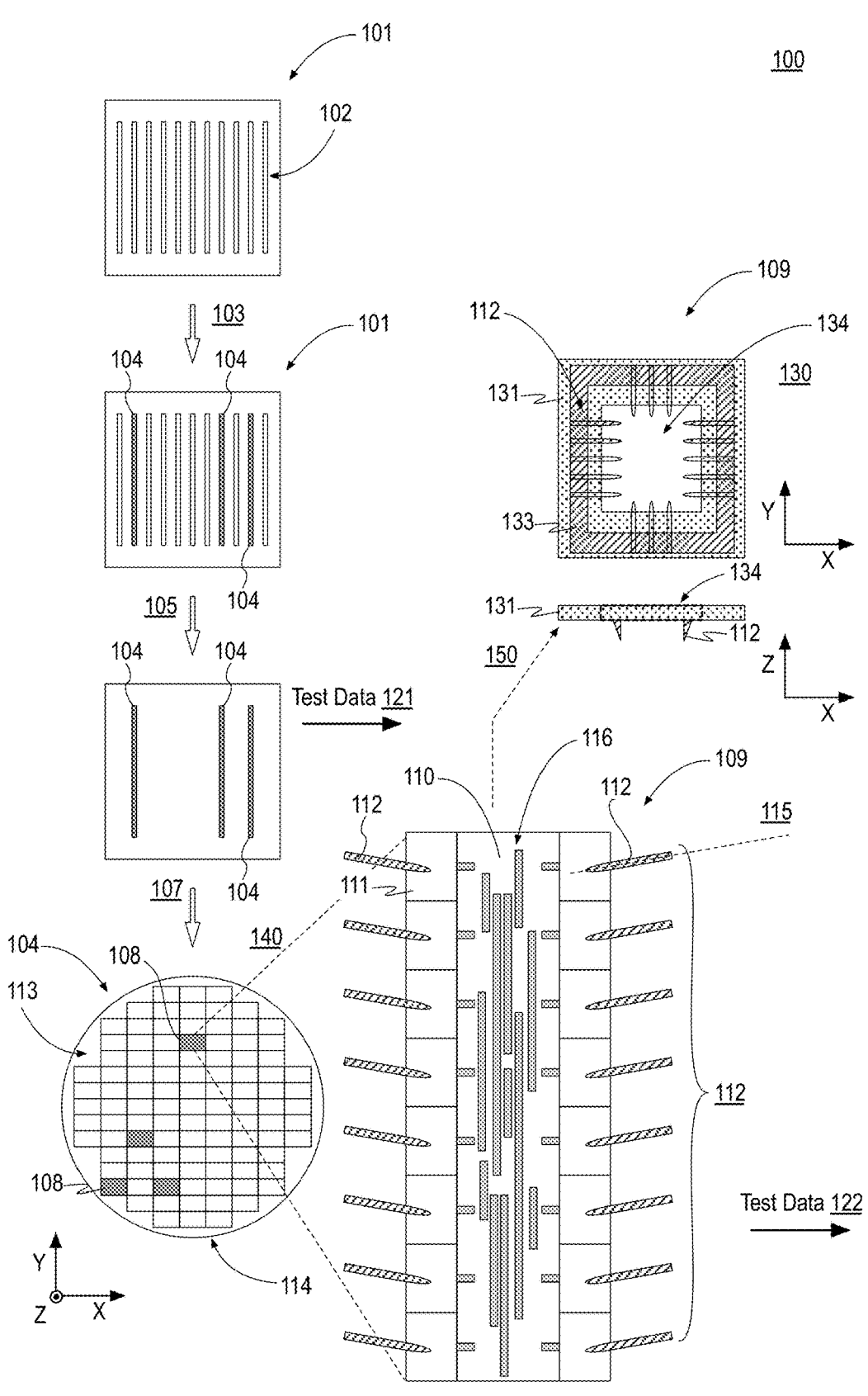
FIG. 1 illustrates an example electron-beam prober testing process and associated operations and device structures.

One or more embodiments or implementations are now described with reference to the enclosed figures. While specific configurations and arrangements are discussed, it should be understood that this is done for illustrative purposes only. Persons skilled in the relevant art will recognize that other configurations and arrangements may be employed without departing from the spirit and scope of the description. It will be apparent to those skilled in the relevant art that techniques and/or arrangements described herein may also be employed in a variety of other systems and applications other than what is described herein.

Reference is made in the following detailed description to the accompanying drawings, which form a part hereof, wherein like numerals may designate like parts throughout to indicate corresponding or analogous elements. It will be appreciated that for simplicity and/or clarity of illustration, elements illustrated in the figures have not necessarily been drawn to scale. For example, the dimensions of some of the elements may be exaggerated relative to other elements for clarity. Further, it is to be understood that other embodiments may be utilized, and structural and/or logical changes may be made without departing from the scope of claimed subject matter. It should also be noted that directions and references, for example, up, down, top, bottom, over, under, and so on, may be used to facilitate the discussion of the drawings and embodiments and are not intended to restrict the application of claimed subject matter. Therefore, the following detailed description is not to be taken in a limiting sense and the scope of claimed subject matter defined by the appended claims and their equivalents.

In the following description, numerous details are set forth. However, it will be apparent to one skilled in the art, that the present invention may be practiced without these specific details. In some instances, well-known methods and devices are shown in block diagram form, rather than in detail, to avoid obscuring the present invention. Reference throughout this specification to "an embodiment" or "one embodiment" means that a particular feature, structure, function, or characteristic described in connection with the embodiment is included in at least one embodiment of the invention. Thus, the appearances of the phrase "in an embodiment" or "in one embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe structural relationships between components. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g., as in a cause an effect relationship, an electrical relationship, a functional relationship, etc.).

The terms "over," "under," "between," "on", and/or the like, as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with the two layers or may have one or more intervening layers. In contrast, a first layer "on" a second layer is in direct contact with that second layer. Similarly, unless explicitly stated otherwise, one feature disposed between two features may be in direct contact with the adjacent features or may have one or more intervening features. The term immediately adjacent indicates such features are in direct contact. Furthermore, the terms "substantially," "close," "approximately," "near," and "about," generally refer to being within +/−10% of a target value. The term layer as used herein may include a single material or multiple materials. As used in throughout this description, and in the claims, a list of items joined by the term "at least one of" or "one or more of" can mean any combination of the listed terms. For example, the phrase "at least one of A, B or C" can mean A; B; C; A and B; A and C; B and C; or A, B and C. The terms "lateral", "laterally adjacent" and similar terms indicate two or more components are aligned along a plane orthogonal to a vertical direction of an overall structure. Herein, the term "completely" indicates not less than 95%, in recognition that absolutes are typically not expected or attainable in patterning contexts. For example, overlaid patterns that substantially fill a region cover not less than 90% of the region while overlaid patterns that completely fill a region cover not less than 95% of the region. Perfectly overlaid patterns fill 99-100% of a merged region. As used herein, the terms "monolithic", "monolithically integrated", and similar terms indicate the components of the monolithic overall structure form an indivisible whole not reasonably capable of being separated.

Wafer level electron beam prober systems, devices, and techniques are described herein related to providing wafer level testing for integrated circuit dies for improved testing turnaround and greater testing flexibility. Such wafer level electron beam prober systems may be used for in-line partially fabricated wafers or for off-line lab applications that provides access to all dice on the wafer instead of individual die to enable streamlined lab operation combining wafer level nano-probing and/or wafer level auto-TEM prep and auto-TEM analysis.

As discussed, identifying and isolating failing circuits and devices is an important aspect of integrated circuit production, with improvements in such fault detection providing the ability to quickly launch new products, adjust process parameters for existing product lines, detect failing equipment, and so on. The techniques discussed herein improve testing turnaround by performing test at the wafer level instead of or in addition to end of line testing. Furthermore, the discussed techniques enable testing for integrated circuit dies that have front and back side metallization.

For context, current optical test approaches are limited by the optical system resolution in the IR range where silicon is transparent (e.g., since the signal needs to go through the silicon to reach the devices or come from the device to reach the imaging system) to a resolution of about 240 nm using 3.0 N.A. solid immersion lens. Such optical tools are not capable of resolving the small features of ever smaller integrated circuit features. Electron beam (e-beam) testing provides better resolution in imaging, even though the beam modulation volume may typically be larger than the beam size due to the charging effect and electron scattering. Electron beam probing also has the advantage of been able to sense signals from both metal traces and semiconductors, is therefore readily applicable to the new advanced structure in semiconductor devices.

The systems and techniques discussed herein advance semiconductor processing and product development testing data turns by providing e-beam probing technology to enable wafer level e-beam probing, for example, at any number of in-line processing steps. Such systems and techniques also have advantages for processing end of line (EOL) wafers. For example, if such wafers are fabricated with a shortened flow typical for test-chips during early process development, EOL applicant provides improved turnaround relative to standard testing flows. Such e-beam probing contacts a first side of a die of a wafer with a probe to provide test signals to the die under test and performs e-beam imaging of the first side of the die while the test signals are provided to the die under test. In in-line contexts, such testing provides critical process monitoring and control data as well as circuit debug and fault isolation capability to shorten learning cycles thereby enabling faster development of processes, process changes, etc. The techniques discussed herein may also leverage wafer level automated transmission electron microscopy (TEM) preparation to provide fast physical dimension measurement, structural and compositional analysis, and defect analysis that advantageously correlates to the process parameters and electrical performance data at a local level. The techniques discussed herein provide advantages including fast information turns for process and product development, process monitoring and control with superior resolution at the node level, and critical debug and fault isolation capability for a variety of integrated circuit structures. The discussed systems and techniques may be deployed as a laboratory tool as a full-wafer e-beam based tool that performs testing on in-line wafers or end of line wafers such as test-chip wafers (i.e., in an end of line lab testing context). Other advantages will be evident based on the following discussion.

FIG. 1 illustrates an example electron-beam prober testing process 100 and associated operations and device structures, arranged in accordance with at least some implementations of the present disclosure. In FIG. 1, a variety of views are provided, which are described in the following discussion.

As shown, a lot 101 of any number of in-line wafers 102 may be received. Although discussed herein with respect to in-line testing for the sake of clarity of presentation, the discussed systems and techniques may be applied to end of line wafers. In-line wafers 102 may be at any process operation in a series of operations used to generate an integrated circuit (IC). For example, in-line wafers 102 may have completed processing to form a semiconductor material, processing to form a source/drain contact material, processing to form a metallization, or the like. For example, in-line wafers 102 may be received for processing as a substrate and semiconductor materials, dielectric materials, metal materials, and so on may be formed on and/or within the substrate to form active and passive devices. Such devices may be interconnected by metallization layers to form an IC. The substrate may be any suitable material such as a semiconductor material. For example, the substrate may include a semiconductor material such as monocrystalline silicon (Si), germanium (Ge), silicon germanium (SiGe), a III-V materials based material (e.g., gallium arsenide (GaAs)), a silicon carbide (SiC), a sapphire (Al$_2$O$_3$), or any combination thereof. In some embodiments, the substrate is silicon. In some embodiments, the substrate is a substantially monocrystalline material. In some embodiments, the substrate includes a buried insulator layer (e.g., SiO$_2$), for example, of a semiconductor-on-insulator (SOI) substrate.

As discussed further herein, a device layer or layers, contact layers, metallization layers, and so on may be formed on or over the substrate (and optionally on or over a back side of the substrate, or the substrate may be completely replaced by such metallization layers) to define a number of IC dies. Notably, during such in-line processing, between such in process IC dies or within the IC dies, test structures and/or test contacts may be provided such that the test structures and/or active structures of the in process IC dies can be electrically accessed and tested. As used herein, the term test structure indicates a structure that is not part of a final product while an active structure indicates a structure that is part of the final product. The techniques discussed herein analyze such test structures and/or active structures to collect test data such that any faults may be corrected.

As shown at operation 103, a number of test wafers 104 of in-line wafers 102 are selected for testing. Such test wafers 104 (e.g., in-line wafers 102, as illustrated, or end of line wafers) may be selected using any suitable technique or techniques to provide, for example, a statistically valid representation of lot 101 or a corresponding batch of in-line wafers 102 or the like. At operation 105, test wafers 104 are pulled for testing and tested using standard testing techniques to provide test data 121. Such standard testing techniques may include any testing other than wafer level e-beam testing such as open air electrical testing, metrology testing, or others. Notably, such testing may be relatively fast and non-invasive. As shown, the collected test data 121 may be provided for evaluation. Such test data 121 may include any suitable test data such as e-test data, critical dimension measurements, functional test data, and so on.

At operation 107, a number of dies for test 108 are selected among all dies of test wafer 104. Such dies 108 may be selected using any suitable technique or techniques. In some embodiments, dies 108 are selected based on a particular failure in the testing at operation 105. In some embodiments, dies 108 are selected based on one or more process parameters being out of a predefined range or nearly out of the predefined range. Notably, dies 108 may be those dies where a fault has been detected or a fault is likely to be detected. In other embodiments, dies 108 are selected without such fault expectation and are instead selected as a representative group of dies 108 for evaluation, similar to the selection of test wafers 104. For example, dies 108 may be selected as a statistically significant or representative group of all dies of test wafer 104.

Also as shown, test wafer 104 has a front side 113 and a back side 114. As used herein, the term front side indicates a side of a wafer where devices and/or metallization layers are being built up in a build up direction (i.e., the z-direction). The term back side indicates the side of the wafer opposite the front side. The back side may also include metallization layers as the contacting and electrical routing to devices (e.g., transistor devices and/or other active and passive devices) on the front side becomes more complex. Notably, the techniques discussed herein inclusive of contacting a die under test using one or more probes and simultaneously imaging the die using an e-beam may be performed on front side 113 or back side 114, with such operations being performed on front side 113 herein for the sake of clarity of presentation. Notably, such contacting and e-beam imaging are performed on the same side whether front side 113 or back side 114.

As discussed, die 108 may have test structures and/or test contacts or pads that are designed for test or are part of the active devices of die 108. As used herein, the term die is inclusive of such active devices (e.g., part of an integrated circuit) and such test structures, regardless of whether such test structures may later be discarded. In any event, as shown in expanded view 140, a probe 109 contacts die 108 at regions 111. As used herein, the terms probe or prober indicates a device or structure that contacts one or more regions of a die to provide test signal(s) to the contacted regions. Such test signals may be any suitable signals to test, stress, evaluate, etc. the relevant structures of die 108. For example, dies 108 may be characterized as devices under test (DUTs). In some embodiments, probe 109 landing on regions 111 (e.g., probe pads) is automated using pattern recognition.

In some embodiments, probe 109 includes a number of probe tips 112 to contact corresponding regions 111 of die 108. Regions 111 may be any suitable material(s) depending on the in-line process operation or end of line structures available to be tested. In some embodiments, regions 111 metal structures. In some embodiments, regions 111 are semiconductor structures. Although illustrated with regions 111 being immediately adjacent, a dielectric material may be provided between individual ones of regions 111. Each of probe tips 112, at various times, frequencies, etc. as testing dictates, transfers and/or receives test signals 115 to or from corresponding regions 111 of die 108. Such regions 111 (i.e., contact regions) are in turn coupled to circuit structures 116 in another region 110 of die 108. For example, regions 111 for contact and region 110 are in different regions of die 108 such as adjacent regions of die 108. Regions 111 are coupled to circuit structures 116 to provide various testing routes for testing of die 108. Such testing routes or structures may be any suitable circuit structures including relatively simple structures such as resistors, single device components (e.g., routes through transistor channels), or more complex testing routes or structures such as circuit components or the like. Notably, regions 111 may couple to any devices, structures, or materials at lower levels or layers than the layer or level at which in-line testing is being performed.

Furthermore, during (and/or before and/or after) such providing of test signals via probe 109, other regions such as region 110 are exposed by an e-beam for e-beam imaging as is discussed further herein. Probe 109 may contact regions 111 while exposing other regions such as region 110 using any suitable technique or techniques. In some embodiments, probe 109 is implemented as a probe card 130, which is shown in detailed view 150. As shown in the side view (i.e., the view looking into the x-z plane), probe card 130 may include a number of probe tips 112 extending below a substrate 131 of probe card 130. For example, substrate 131 may be dielectric substrate such as printed circuit board or similar material. Probe tips 112 may surround a translucent or transparent region 134, which may be implemented as an open region of probe card 130. As used herein, the terms translucent or transparent indicate the transmission of an e-beam. For example, probe tips 112 are adjacent a perimeter of probe card 130 and probe card 130 includes translucent or transparent region 134 (e.g., an open region) in an interior of probe card 130 at least partially surrounded by the perimeter.

As shown in the top down view (i.e., the view looking down into the x-y plane), probe tips 112 may extend inwardly into the interior from a routing region 133 formed on or in substrate 131 such that routing region 133 provides metallization (e.g., metal lines) to route test signals 115 to probe tips 112. For example, probe card 130 may be provided as a cantilever blade probe card, however, any probe tip (or needle) type, materials, or the like may be deployed.

As discussed, during test of die 108, test signals 115 are provided and/or received to and/or from die 108 and e-beam imaging is performed to attain test data 122. Test data 122 may be stored for further evaluation and for correlation to additional test data as discussed further herein below. Such test signaling and e-beam imaging may provide any suitable e-beam test functionality (i.e., based on test signal 115 and a detected e-beam signal, discussed further herein below) such as e-beam signal image mapping (ESIM), e-beam logic state imaging (ELSI) (pad-level ELSI may be referred to as StaMPS), optical-electrical fault mapping (OEFM), e-beam device perturbation (EDP), or stroboscopic e-beam signal image mapping.

In some embodiments, using ESIM, an electron beam is scanned over an area containing an integrated circuit structure and a gate electrode of the device of interest is toggled at a specific frequency. A detected e-beam is amplified and sent to a lock-in amplifier or spectrum analyzer tuned to the specific frequency with the output of the lock-in amplifier or spectrum analyzer fed into a scan control unit that raster scans over the area. When the electron beam illuminates part of circuit element such as a metal line or semiconductor under a device, the detected e-beam is modulated by the electrical signal, with devices that toggle showing contrast against the background, allowing for mapping of devices that toggle at the driving frequency.

In some embodiments, ELSI allows detection and display of a logic state of an integrated circuit structure static e-beam logic state imaging or dynamic e-beam logic state imaging. Using static ELSI techniques, the integrated circuit structure is put in a specific state by halting a tester pattern. A secondary electron image of the integrated circuit structure is collected with the integrated circuit structure displaying different contrast at high or low voltage states, allowing identification of the individual device logic states. Using dynamic ELSI techniques, an e-beam is scanned over an area containing the integrated circuit structure and, instead of gate modulation, Vcc power supply of the integrated circuit structures or devices of interest is modulated at a specific frequency. A detected e-beam signal is amplified then sent to a lock-in amplifier or spectrum analyzer tuned to the specific frequency with the output of the lock-in amplifier or spectrum analyzer fed into a scan control unit that raster scans over the area. In an embodiment, a signal from the lock-in amplifier or spectrum analyzer is to be brighter than the rest of the area or areas scanned and, since the Vcc is modulated, only the integrated circuit structure or device that is connected to Vcc shows the modulation, which allows mapping of logic states.

In some embodiments, in OEFM, an electron beam is used for ESIM or ELSI while testing the chip at the boundary of a pass and fail state (e.g., at specific voltage or frequency). For example, a laser beam may be used to illuminate an area that includes an integrated circuit structure to modulate the integrated circuit structure such that the laser modulation alters the defective device enough to change the testing structure from pass to fail, or vice versa. For example, such altering allows for detection and localization of failing devices or cells responsible for marginal fail at a specific range in voltage or frequency.

In some embodiments, in EDP, a chip is placed under test at a boundary of pass and fail (e.g., at specific temperature, voltage or frequency) and an e-beam is used for device perturbation. The electron beam may be raster scanned over the area of interest while the die is running a specific pattern at the pass/fail boundary condition. When the electron beam hits a device and changes the chip from passing to fail (or vice versa), the location of the marginal device is recorded.

In addition or in the alternative, other e-beam probing techniques may be deployed inclusive of electron beam absorption current (EBAC), electron beam induced current (EBIC), and electron beam induced resistance change (EBIRCH). Such techniques may be used for failure site localization at the wafer-level probing. For example, such techniques may be used for fault isolation of resistor like structures or metal structures. For example, any number and type of e-beam techniques may be used in any combination for any devices under test such as active devices or structures, passive devices or structures, logic devices or structures, digital devices or structures, memory devices or structures, and so on.

Notably, such e-beam probing provides better resolution (e.g., >10×) relative to optical probing tools with the advantage of detecting signals from metal structures and semiconductor structures. The techniques discussed herein apply e-beam probing at the wafer level and may be used in combination with pattern recognition and/or probing automation to provide fault isolation and failure analysis results in a fraction of the time needed in conventional fault isolation and failure analysis flow at the unit level. When applied in-line such techniques may provide wafer level e-beam probing at multiple processing steps before the end of line to provide critical process monitor and control data, circuit debug and fault isolation capability, and other advantages. Thereby, learning cycle time is reduced to enable faster development of processes. Furthermore, such techniques may save wafers from been scrapped for such detected faults to allows faster turnaround time in process development and yield improvement. The discussed techniques may leverage wafer level automated TEM preparation to provide fast physical dimension measurement, structural and compositional analysis, and defect analysis information that advantageously 'correlates to the process parameters and electrical performance data at a local level.

As shown in FIG. 1, test data 121 from test operation 105 and test data 122 from test operation 105 are stored and analyzed. Test data 121, 122 may be in any suitable format and may be stored in any suitable local or remote device.

Discussion now turns to the use of test data 121, 122 in the context of additional testing operations.

Figure 2:
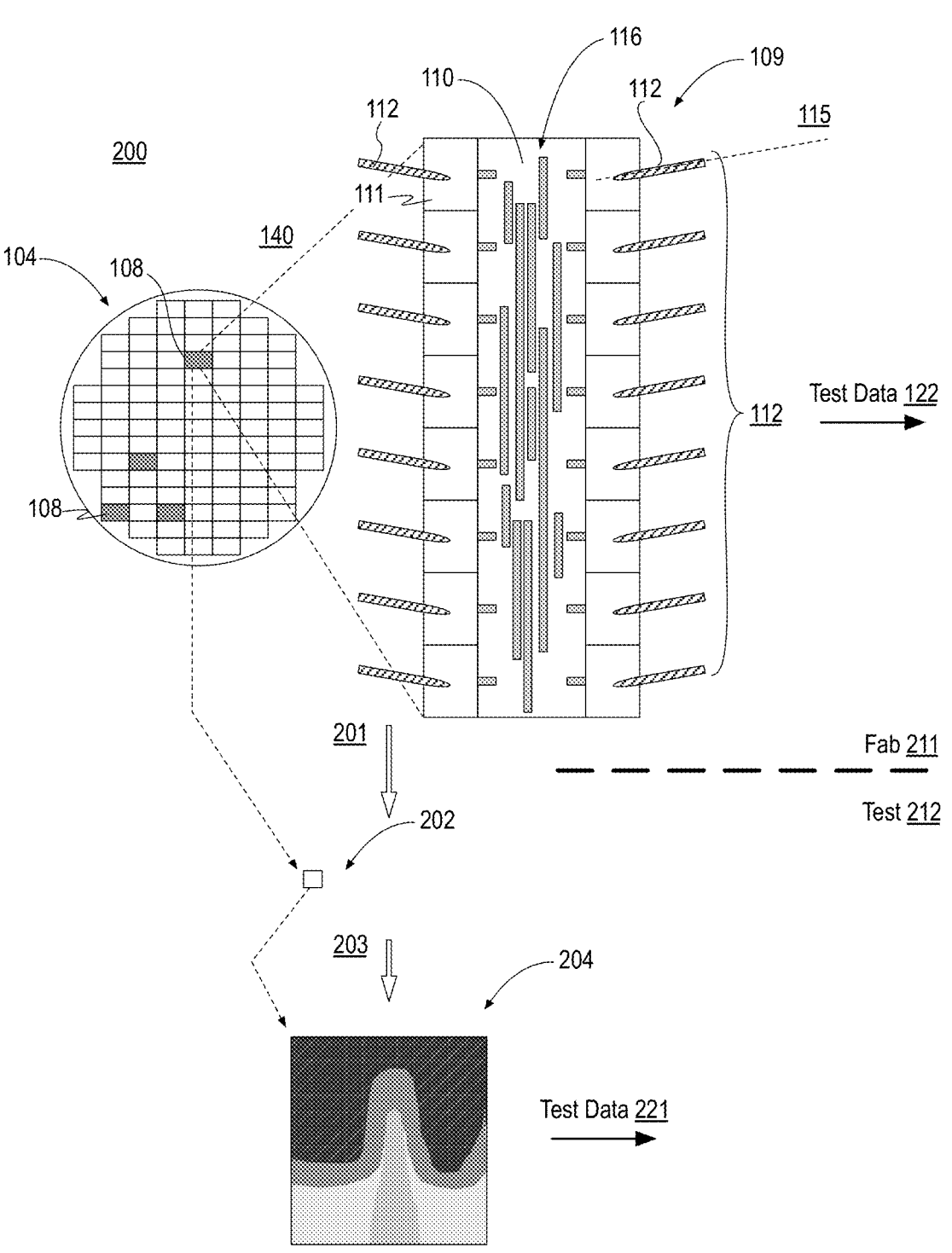
FIG. 2 illustrates exemplary de-processing and sample evaluation based on test data generated using electron-beam probing.

FIG. 2 illustrates exemplary de-processing and sample evaluation 200 based on test data generated using electron-beam probing, arranged in accordance with at least some implementations of the present disclosure. As shown in FIG. 2, subsequent to the discussed test operations inclusive of operation 107 where e-beam probing is performed, based on test data 122 (and optionally test data 121), a determination may be made as to whether sampling or other additional testing of a particular device structure of interest is needed.

Such a determination may be made using any suitable technique or techniques such as evaluation of a failed e-beam prober test, evaluation of test data deemed to be at or near a failure metric, and so on. As shown, when a determination is made that a sample is needed, a particular die 108 of test wafer 104 is processed at operation 201 (i.e., a de-process operation) and a small piece of material or structure from die 108 removed from fab 211 to test 212 to attain a sample 202. For example, a small piece may be lifted off die 108 for further nano-probing, physical analysis, and/or TEM sample prep. The small void left behind may be filled to that the wafer may be put back in line to continue processing. The sample may be attained using any suitable technique or techniques such as material removal operations or the like. In some embodiments, test wafer 104 is scrapped after such sampling. In other embodiments, test wafer 104 may be further processed and sent back to the line after such sampling. For example, the void left by the sampling may be filled with a material and the wafer may continue processing, or, if applicable, the wafer may be de-processed of a particular layer or layers and sent back to the line for repeat processing.

As shown, at evaluation operation 203, sample 202 may be evaluated using any suitable technique or techniques such as TEM processing, or other metrology or evaluation operations to provide test data 221. For example, test data 221 may include critical dimensions (i.e., thicknesses, line widths, etc.) of features 204 of sample 202, material characteristics of features 204, subjective technical evaluation of features 204, and so on.

Any combination of test data 121, 122, 221 may then be used to make relevant process changes to correct the detected faults. Notably, the-beam probing discussed herein provides early fault detection, improved test data, and other advantages to reduce turnaround times for process improvements.

Figure 3:
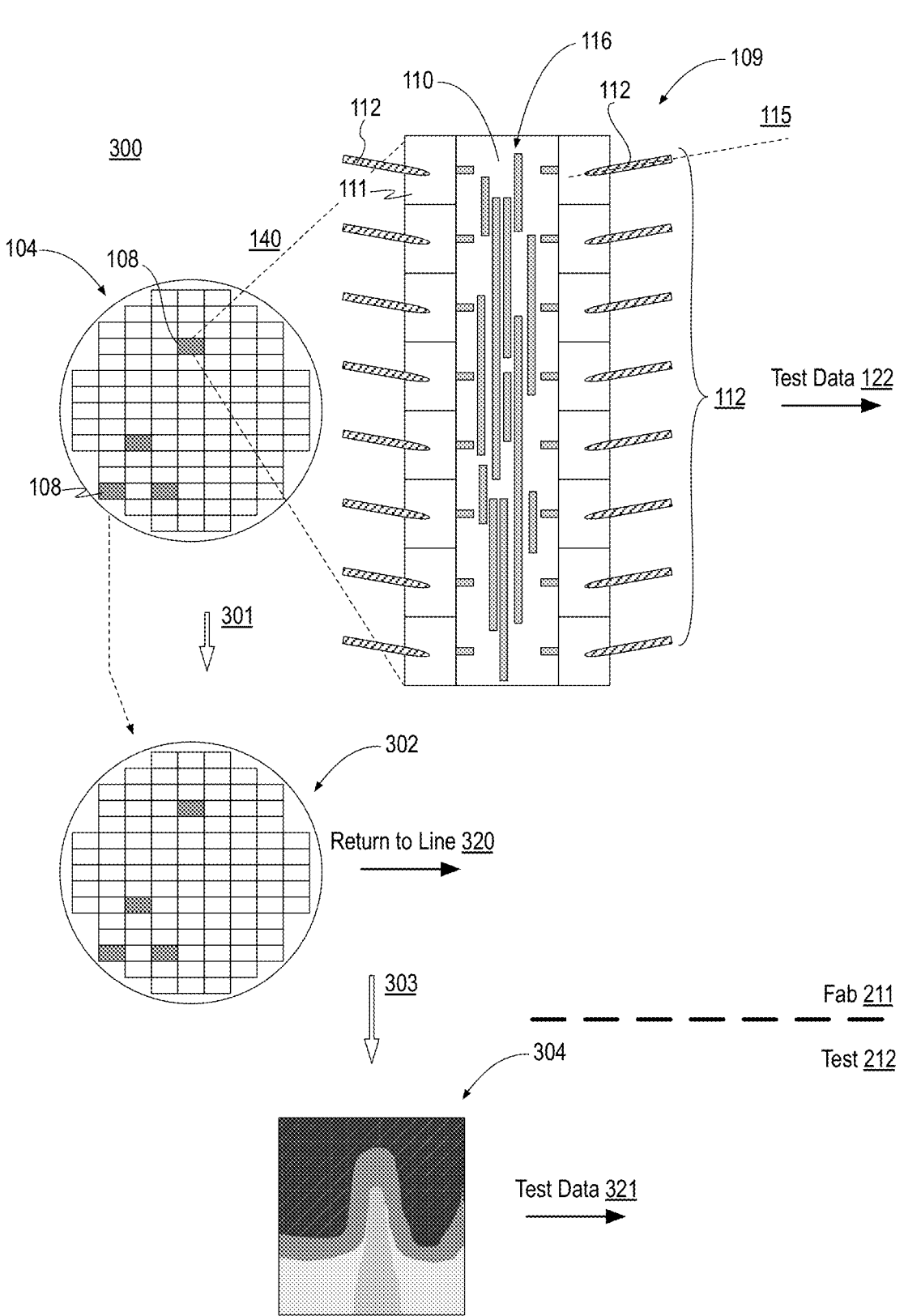
FIG. 3 illustrates exemplary automated testing based on test data generated using electron-beam probing.

FIG. 3 illustrates exemplary automated testing 300 based on test data generated using electron-beam probing, arranged in accordance with at least some implementations of the present disclosure. As shown in FIG. 3, subsequent to the discussed test operations inclusive of operation 107 where e-beam probing is performed, based on test data 122 and/or test data 121, processing continues with a determination as to whether automated sampling and/or other additional testing of a particular device structure of interest is needed.

The determination as to whether additional testing may be made using any techniques discussed with respect to FIG. 2 such as evaluation of a failed e-beam prober test or evaluation of test data deemed to be at or near a failure metric. When a determination is made that a sample is needed, test wafer 104 is processed at operation 301 in preparation for a processed wafer 302 to return to the line for processing at operation 320. In some embodiments, operation 301 includes automated TEM processing where a sample is taken for TEM and test wafer 104 is processed to form processed wafer 302. Such processing may include automated sample removal, and then fill with a material where the sample was removed to provide processed wafer 302.

As shown, at operation 303, the sample is processed via automated TEM processing. For example, TEM sample lift out may be automated to extract TEM samples that are similar or smaller than the size of on regions 111 (e.g., probe pads). In some embodiments, a wafer level automated TEM preparation tool and automated TEM analysis tool are deployed to generate test data 321. For example, test data 321 may include critical dimensions (i.e., thicknesses, line widths, etc.) of features 304 of the sample, material characteristics of features 304, subjective technical evaluation of features 304, and so on.

Figure 4:
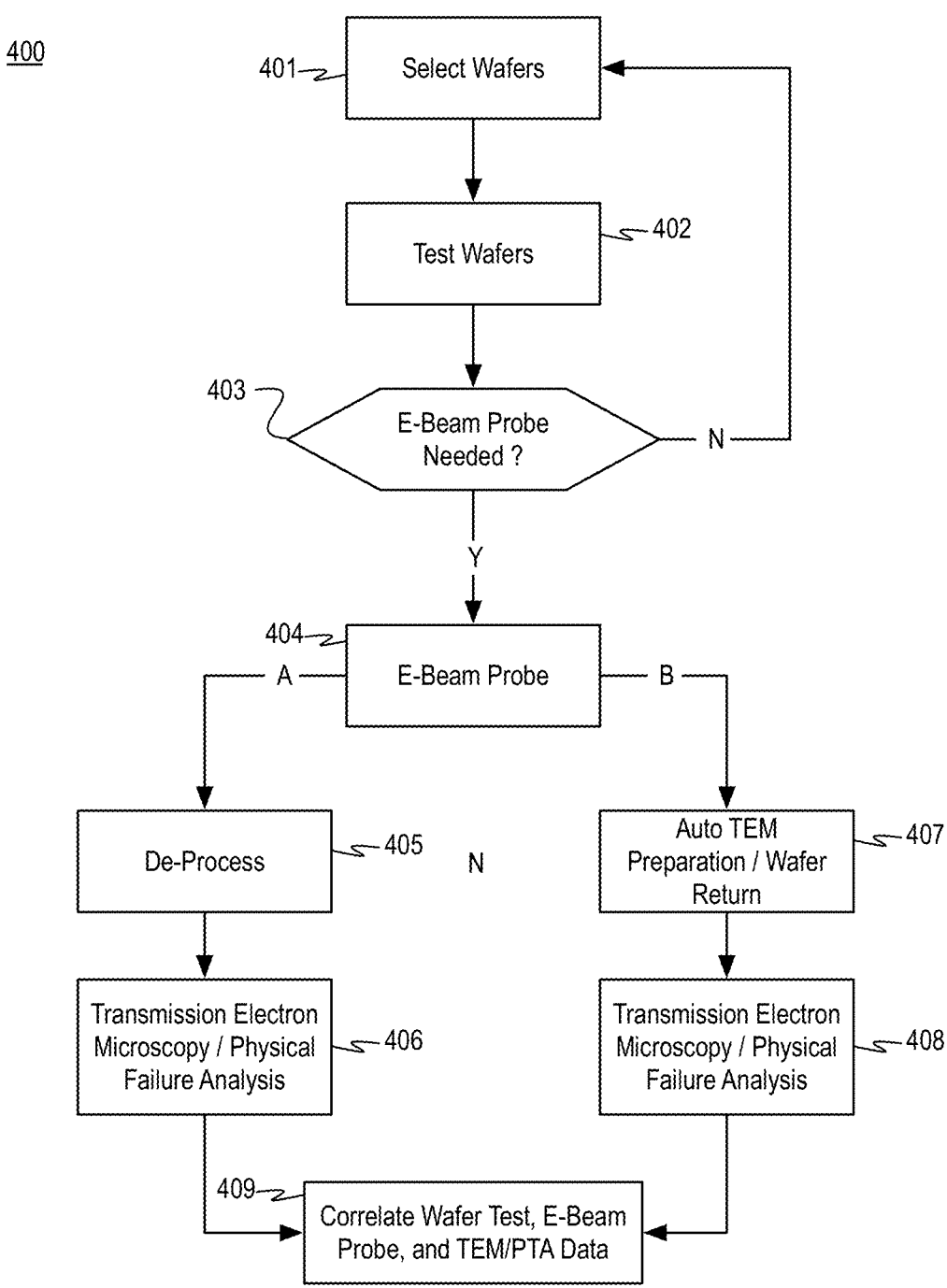
FIG. 4 is a flow diagram illustrating an example process for providing wafer level electron-beam probe testing.

FIG. 4 is a flow diagram illustrating an example process 400 for providing wafer level electron-beam probe testing, arranged in accordance with at least some implementations of the present disclosure. As shown, process 400 begins at operation 401, where wafers are selected for test. In some embodiments, the selected wafers are in-line wafers. Such in-line wafers may be at any operation in an in-line flow where test pads are available for contact for testing, such as after formation of a low level metallization layer. In some embodiments, the selected wafers are end of line wafers. For example, such end of line wafers may be obtained after a full fabrication flow is performed.

Processing continues at operation 402, where the selected wafers are tested using techniques other than e-beam probing such as open air electrical testing, metrology operations, or the like. Processing continues at decision operation 403, where a determination as to whether e-beam probe testing is needed. Such a determination may be made based on whether any of the testing at operation 402 indicates potential failure, based on evaluation of other test data pertinent to the product line, need for additional data, or the like. If e-beam probe testing is not needed, processing continues at operation 401 until such testing is need.

If e-beam probe testing is needed, processing continues at operation 404, where the selected dies are probed. Such e-beam probing may be performed using any techniques discussed herein. In some embodiments, a wafer having at least one die for testing is received for processing, a first region of a first side of the die is contacted, a test signal corresponding to the first region of the first side the die is provided or received, an e-beam is emitted on a second region of the first side of the die, and an e-beam signal is received from the second region of the first side of the die. As used herein the term e-beam signal indicates a signal corresponding to an e-beam emitted onto a surface such as a signal received at a detector or a processed version of the signal received at the detector.

Notably, a vacuum may be pulled to perform such e-beam probing. Processing may continue at operation 404, during such vacuum, to process any number of dies using the same or different e-beam probing techniques. Thereby, one or more dies are processed at a wafer level without vacuum break. After operation 404, processing may continue at operation 405 or 407. At operation 405, the wafer may be pulled from the fab for test based de-process and sample preparation. At operation 406, the resultant sample is TEM processed to generate image data, sample data, or the like and/or physical failure analysis is performed to determine the reason for any failure detected, and/or electrical nano-probing is performed to obtain further electrical characterization of the local structure or device/or devices. Alternatively, at operation 405, the wafer may be pulled from the fab for test based de-process and sample preparation. At operation 407, automated TEM preparation and wafer repair may be performed such that the wafer may be returned to the line for further processing. At operation 408, the resultant sample is TEM processed to generate image data, sample data, or the like and/or physical failure analyzed to determine the reason for any failure detected.

Continuing from operation 406 or 408, processing continues at operation 409, where the wafer test data generated at operation 402, the e-beam probe data generated at operation 404, the transmission electron microscopy/physical failure analysis (TEM/PTA) data generated at operation 406 or 408, and the electrical nano-probing characterization data generated at operation 406 are correlated to provide feedback to the process line to adjust processing.

Figure 5:
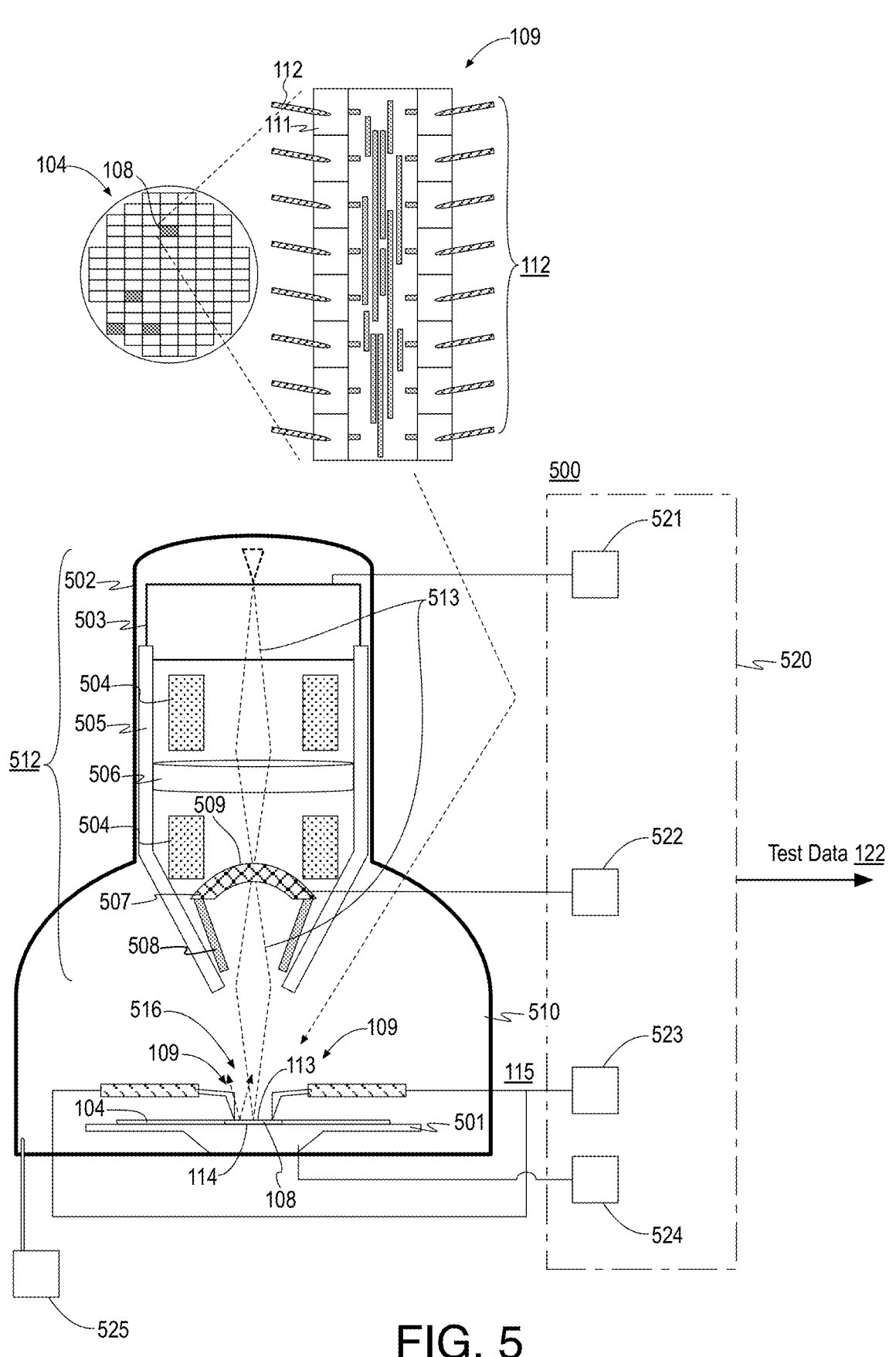
FIG. 5 is an illustration of an example wafer level electron-beam prober for performing wafer level e-beam probing.

FIG. 5 is an illustration of an example wafer level electron-beam prober 500 for performing wafer level e-beam probing, arranged in accordance with at least some implementations of the present disclosure. As shown in FIG. 5, wafer level e-beam prober 500 includes an e-beam column 512 within housing 502. For example, e-beam column 512 may be an electron microscope column. E-beam column 512 may include an electron gun 503, which may produce either a continuous electron beam or a pulsing electron beam, slim lenses 504, guide or enclosure 505, aperture system 506, a detector 509, and guide 508 within enclosure 505. E-beam column 512 may include additional components to generate and guide an e-beam 513 and to detect e-beam signal 516. As shown, under control of e-beam controller 521, e-beam column 512 emits or delivers an e-beam 513 to test wafer 104 and, in particular, to a die 108 under test (or device under test, DUT). E-beam column 512, or at least a portion thereof, a wafer stage 501 (under control of stage controller 524), or at least a portion thereof, and probe 109 are within a chamber 510 enclosed by housing 502. As shown, vacuum 525 may pull a vacuum within chamber 510 during testing of those dies 108 of test wafer 104 that are to be tested. As illustrated, in some embodiments, probe 109 contacts regions 111 of front side 113 while e-beam 513 is emitted on front side 113. In other embodiments, probe 109 contacts regions 111 of back side 114 while e-beam 513 is emitted on back side 114.

Also as shown, wafer level e-beam prober 500 includes a probe signal controller 523 to transmit test signals 115 via probe 109. Probe signal controller 523 may also receive test signals from probe 109. Detector 509, which is in the path of e-beam signal 516 (e.g., a reflected e-beam or reflected electron radiation) is coupled to a detected signal analyzer 522. Detected signal analyzer 522 receives a detection signal and may translate the received signal to image data or any other suitable data structure.

E-beam controller 521, detected signal analyzer 522, probe signal controller 523, and stage controller 524 may be implemented via a computing or control system 520, which outputs test data 122. Control system 520 may include any integrated circuits, controllers, memory, etc. to provide control of various corresponding components, inclusive of vacuum 525.

In operation, test wafer 104 is received for processing on wafer stage 501 and a vacuum is drawn or pulled in chamber 510. Under control of stage controller 524, die 108 is positioned for test in alignment with probe 109 and e-beam column 512. Die 108 is then contacted by probe 109 (by raising wafer stage 501 or lower probe 109) and die 108 is tested using any test techniques discussed herein. For example, test signals 115 may be provided and during such test signaling, images based on detector 509 receiving e-beam signal 516 are generated and saved for analysis. In some embodiments, a laser (not shown) is used to activate die 108 during test. In some embodiments, e-beam 513 is used to active die 108 during test. In some embodiments, probe signal controller 523 monitors electrical signals during test and records the data to test data 122

After testing die 108, during the same vacuum being drawn or pulled, wafer stage 501 is deployed to position another die 108 for test. The current die 108 is then contacted by probe 109 and testing again commences. The same or different tests may be applied to each die 108 of test wafer 104 to be tested. Furthermore, any number of dies 108 may be tested during the current drawn or pulled vacuum. After each die 108 to be tested is completed, the vacuum is released and test wafer 104 is withdrawn from chamber 510. Test wafer 104 may then be de-processed to attain samples for TEM, processed using automatic TEM processing, or the like as discussed herein with respect to FIGS. 2 and 3.

The systems and techniques discussed herein provide a variety advantages. For example, in-line wafer level e-beam probing may be deployed starting at lower metal layers to provide faster fault isolation and failure analysis. Combined with auto-TEM and automated TEM analysis, such techniques provide shorter learning cycle time to accelerate process development and to increase detection accuracy and capability for subtle process defects (e.g., as in FIG. 2). When the e-beam probing and auto-TEM are used in-line, the wafer may also be sent back to the line to continue processing to the end of line, which can save wafer cost and provide excellent correlation between the in-line testing and end of line testing (e.g., as in FIG. 3).

Figures 6, 7:
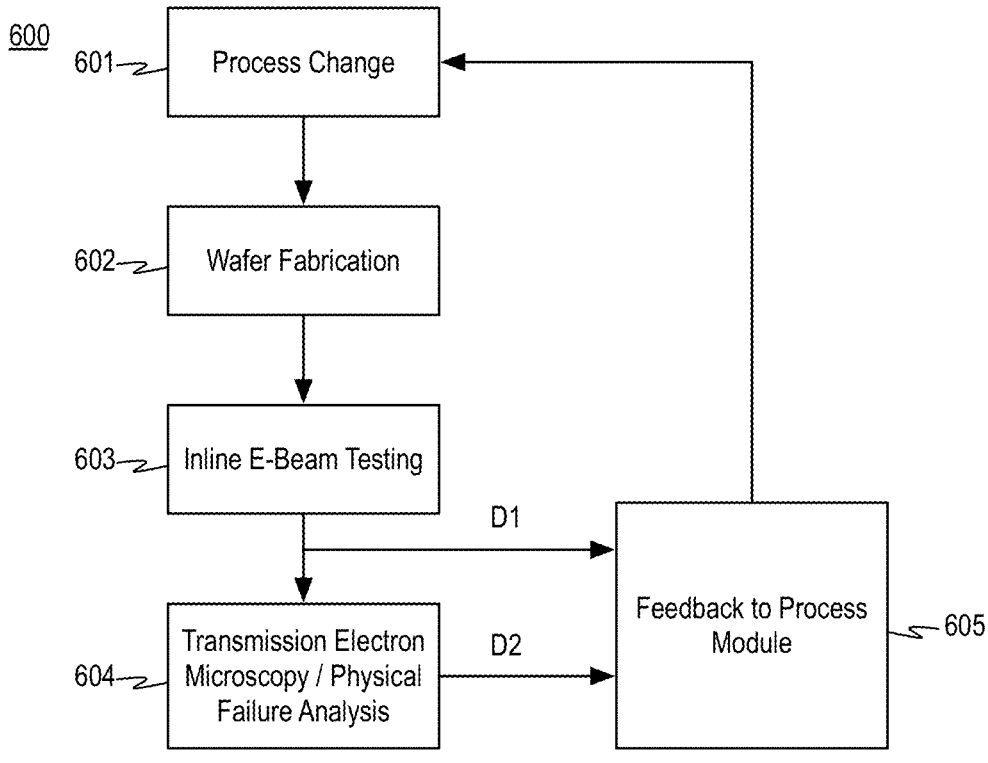
FIG. 6 is a flow diagram illustrating an example process for using electron-beam probe testing to reduce process change cycle time.
FIG. 7 illustrates cross-sectional side views of example device structures for electron-beam probe testing.

FIG. 6 is a flow diagram illustrating an example process 600 for using electron-beam probe testing to reduce process change cycle time, arranged in accordance with at least some implementations of the present disclosure. As shown, process 600 begins at operation 601, where a process change is made. The process change may be any suitable process change such as a recipe change (e.g., anneal duration, etch duration, etc.), a change to material deployed, or the like.

Processing continues at operation 602, where wafer fabrication operations inclusive of the process change of operation 601 are performed to fabricate the in-line wafers to a point at which targeted in-line e-beam testing may be performed. Processing continues at operation 603, where e-beam testing is performed. Such e-beam testing may include any testing discussed herein inclusive of ESIM, ELSI, OEFM, EDP, stroboscopic e-beam signal image mapping, EBAC, EBIC, EBIRCH, or others. Furthermore, other testing corresponding to such e-beam testing inclusive of prior testing other than e-beam as discussed herein.

As shown, at operation 605, test data from such testing may be provided as feedback to the process module responsible for the process change of operation 601 to validate the change or indicate further changes are needed. Notably, the feedback provided from operation 603 to operation 605 may be provided at a duration of D1, which is, for example, not greater than 1 day of processing time. Thereby, a quick turnaround is provided to validate process changes or to indicate further changes are needed.

Furthermore, processing may continue from operation 603 at operation 604, where transmission electron microscopy/physical failure analysis testing and evaluation is performed as discussed herein. As shown from operation 604 to operation 605, test data from the TEM/PFA testing may again be provided as feedback to the process module responsible for the process change of operation 601. The feedback provided from operations 603, 604 to operation 605 may be provided at a duration of D2, which is greater than D1. For example, D2 may be not greater than 2 days of processing time. Again, a quick turnaround is provided to validate process changes or to indicate further changes are needed. Such one to two day turnaround for testing data may be contrasted with end of line evaluation, which typically takes on the order of multiple weeks to turn.

FIG. 7 illustrates cross-sectional side views of example device structures 700 for electron-beam probe testing, arranged in accordance with at least some implementations of the present disclosure. For example, device structures 700 may be or include partially fabricated integrated circuit structures. As used herein, the term integrated circuit indicates a fully or partially fabricated integrated circuit device. As discussed, e-probe testing may be performed on any suitable device structures. FIG. 7 illustrates in-line device structures, which may be contacted to via regions 111 as discussed herein. On the left of FIG. 7, a parallel to gate view 791 is provided such that parallel to the gate refers to the gate of transistor 712. On the right of FIG. 7, an orthogonal to gate view 792 is provided such that orthogonal to the gate refers to the gate of transistor 712. Such views are divided by a vertical line to indicate they are separate views and are not a continuous view of device structures 700.

As shown in FIG. 7, circuitry 781 may be formed on and/or over substrate 741, such that circuitry 781 includes transistors 712. Transistors 712 include semiconductor channel structures 706 between source and drain structures 707, 708. Channel structure 706 and source and drain structures 707, 708 may be formed in a doped well of substrate 741 or they may be formed within and/or over substrate 741. Source and drain contacts 702, 703 are on source and drain structures 707, 708 and separated from a gate structure (inclusive of gate electrode 705 and gate dielectric layer 704) by optional dielectric spacers 734. For example, source and drain contacts 702, 703 may define a transistor contact layer. In some embodiments, the transistor contact layer further includes gate contacts. Gate electrode 705 may include any suitable material such as a metal or highly doped material. For example, gate electrode 705 may be or include ruthenium, palladium, platinum, cobalt, nickel, conductive metal oxides, hafnium, zirconium, titanium, tantalum, aluminum, alloys of these metals, carbides of these metals, or others. Transistors 712 may be formed using any suitable technique or techniques such as deposition techniques, patterning (e.g., lithography and etch) techniques, implant techniques, planarization techniques, epitaxial growth techniques, and so on.

Device structures further include metallization layers 731 embedded in dielectric material 742. Metallization layers 731 may be any suitable metal and provide interconnection of transistors 712 and any other devices of circuitry 781. Metallization layers 731 may be formed using any suitable technique or techniques such as single or dual damascene techniques or the like. Although illustrating metal layers M1-M4 and via layers V0-V3, any number of such layers may be deployed such as metal layers M1-M11 and via layers V0-V10, or the like. Although shown with V0 directly on the transistor contact layer including source and drain contacts 702, 703, in other embodiments a metal layer is directly on the transistor contact layer.

As discussed herein, at any layer of circuitry 781 and/or metallization layers 731, in-line testing may be performed on device structures of active circuitry 781 or corresponding test structures adjacent circuitry 781. In some embodiments, probe 109 is to contact region 111 of die 108 such that region 111 is part of one of metallization layers 731. In some embodiments, the contacted metallization layer is a first or second metal layer directly over the transistor contact layer including source and drain contacts 702, 703. For example, probe 109 may contact a metallization that is a part of V0 or M1. In some embodiments, probe 109 contacts a metallization structure that is a part of V0, M1, V1, M2, V2, M3, V3, or M4. However, any metallization may be contacted. Such metallization contact may be used to evaluate a semiconductor material such as channel structure 706, or a semiconductor material may be contacted directly. For example, probe 109 may contact region 111 such that region 111 is a part of a layer including channel structure 706.

Figure 8:
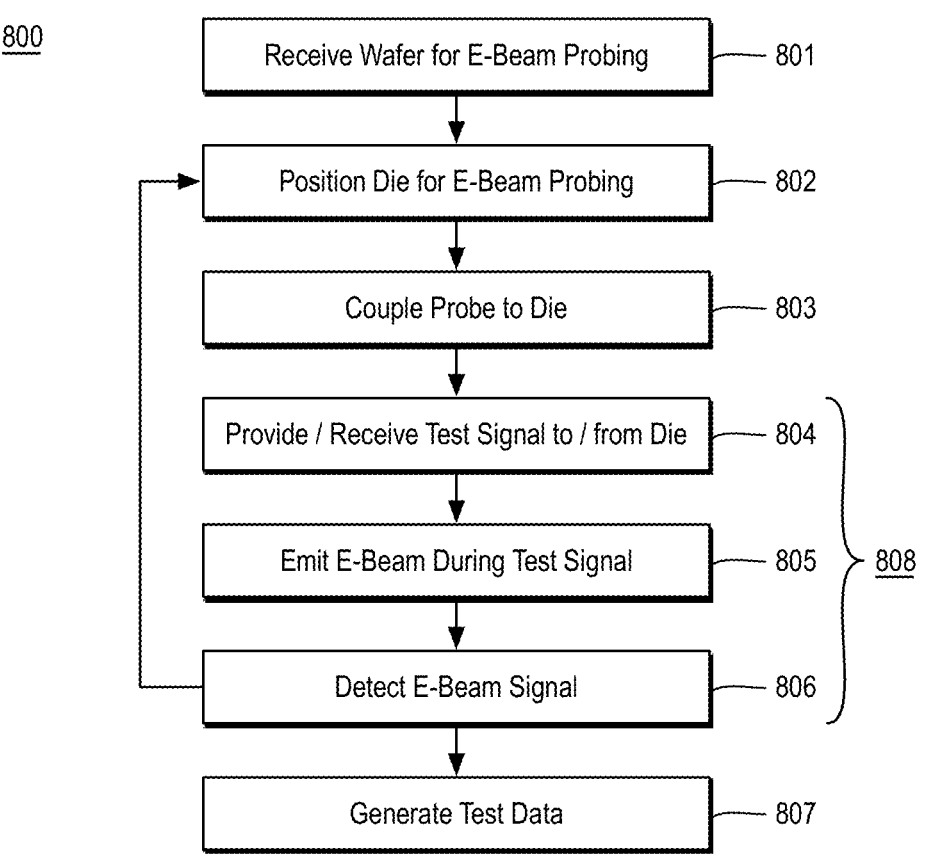
FIG. 8 is a flow diagram illustrating an example process for performing electron-beam prober testing.

FIG. 8 is a flow diagram illustrating an example process 800 for performing electron-beam prober testing, arranged in accordance with at least some implementations of the present disclosure. Process 800 may include one or more operations 801-807 as illustrated in FIG. 8. Process 800 may form at least part of an in-line e-beam probing process. By way of non-limiting example, process 800 may form at least part of a super resolution image generation process as performed by wafer level e-beam prober 500 as discussed herein. Furthermore, process 800 will be described herein with reference to system 900 of FIG. 9.

Figure 9:
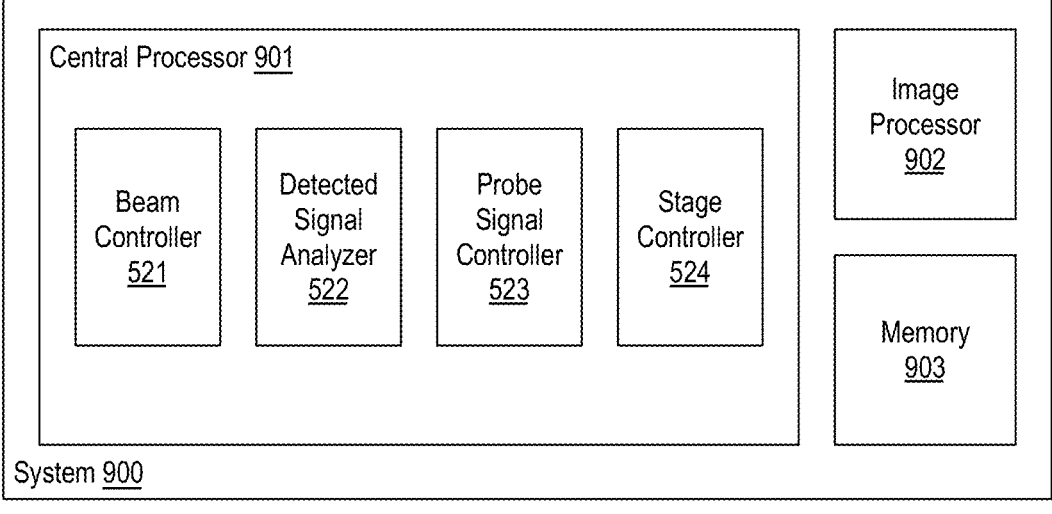
FIG. 9 is an illustrative diagram of an example system for performing electron-beam prober testing.

FIG. 9 is an illustrative diagram of an example system 900 for performing electron-beam prober testing, arranged in accordance with at least some implementations of the present disclosure. As shown in FIG. 9, system 900 may include beam controller 521, detected signal analyzer 522, probe signal controller 523, and stage controller 524 implemented by a central processor 901. System 900 may further include any other processor circuitry to provide control functions for operations discussed herein. As shown, system 900 may further include an image processor 902, and a memory 903

As shown, in some examples, one or more or portions of beam controller 521, detected signal analyzer 522, probe signal controller 523, and stage controller 524 are implemented via central processor 901. However, beam controller 521, detected signal analyzer 522, probe signal controller 523, and stage controller 524 may be implemented, at least in part, by any components of system 900. In some examples, one or more or portions of beam controller 521, detected signal analyzer 522, probe signal controller 523, and stage controller 524 are implemented in hardware as a system-on-a-chip (SoC). In some examples, one or more or portions of beam controller 521, detected signal analyzer 522, probe signal controller 523, and stage controller 524 are implemented in hardware via a FPGA.

Image processor 902 may include any number and type of image or graphics processing units that may provide the operations as discussed herein. Such operations may be implemented via software or hardware or a combination thereof. For example, image processor 902 may include circuitry dedicated to manipulate and/or analyze images obtained from memory 903. Central processor 901 may include any number and type of processing units or modules that may provide control and other high level functions for system 900 and/or provide any operations as discussed herein. Memory 903 may be any type of memory such as volatile memory (e.g., Static Random Access Memory (SRAM), Dynamic Random Access Memory (DRAM), etc.) or non-volatile memory (e.g., flash memory, etc.), and so forth. In a non-limiting example, memory 903 may be implemented by cache memory.

Returning to discussion of FIG. 8, process 800 begins at operation 801, where a wafer is received for test. In some embodiments, wafer stage 501 receives test wafer 104 to test one or more dies 108. In some embodiments, after test wafer 104 is received by wafer stage 501 and secured within chamber 510, a vacuum is pulled such that test wafer 104 is in a vacuum environment.

Processing continues at operation 802, where a first die for test is positioned for testing of the first die. The first die may be positioned using any suitable technique or techniques. For example, wafer stage 501 may be positioned under control of stage controller 524 to drive wafer stage 501 to a position such that the first die is under probe 109 and e-beam column 512.

Processing continues at operation 803, where a probe is coupled to the first die. For example, probe 109 may be coupled to die 108 as discussed herein. In some embodiments, wafer stage 501 raises to couple probe 109 to die 108. In some embodiments, probe 109 lowers to coupled probe 109 to die 108. For example, one or more of regions 111 may be contacted by corresponding ones of probe tips 112.

Processing continues at operation 804, where a test signal is provided to and/or received from the first die under test, at operation 805, where an e-beam is emitted onto the first die under test, and at operation 806, where an e-beam signal corresponding to the e-beam is detected. For example, as shown with respect to operation grouping 808, such operations may be performed in concert to generate e-beam images, test signal data, and the like using the e-beam prober. In some embodiments, test signals and/or other energy sources (e.g., lasers) may be provided to the die and corresponding images may be generated using the e-beam imaging capability. In some embodiments, the e-beam emission may be used as an energy or perturbation source and test signals and/or e-beam signal images are attained. In some embodiments, a test signal is provided to one or more of regions 111 of front side 113 of die 108, an e-beam is emitted on region 110 of front side 113 of die 108, and e-beam signal 516 is received by detector 507 and analyzed.

Processing continues at operation 807, where test data corresponding to the performed test are generated and stored for evaluation as discussed herein. In some embodiments, process 800 further includes performing, based on test data corresponding to operations 801-807, at least one of e-beam signal image mapping, e-beam logic state imaging, optical-electrical fault mapping, e-beam device perturbation, or stroboscopic e-beam signal image mapping.

As shown, processing may continue from operation 806 at operation 802 such that a second die for testing may be evaluated using the same or similar techniques. For example, at operation 802, the second die may be positioned for testing. At operation 803, the probe is coupled to the die and, at operations 804, 804, 806, e-beam testing as discussed herein is performed. The testing of the second die may be of the same or a different type with respect to the testing performed on the first die. Any number of dies of the received wafer may be processed in the same manner. In some embodiments, such operations are performed while a pulled vacuum is maintained in the chamber surrounding the wafer received at operation 801. For example, test wafer 104 may be received, secured in chamber 510, a vacuum may be pulled, and any number of dies 108 may be tested during such vacuum pull for efficient processing.

In some embodiments, a vacuum is pulled in chamber 510 surrounding test wafer 104 such that test wafer 104 includes a number of dies 108 for testing during said pulling the vacuum, positioning a first die for testing, and, during the pulling of the vacuum: providing a first test signal to the first die, attaining a first e-beam signal corresponding to the first die, positioning a second die for testing, providing a second test signal to the second die, and attaining a second e-beam signal corresponding to the first die. Separate test data may then be generated for both the first and second dies. In some embodiments, the first test signal provides a first test type and the second test signal provides a second test type other than the first test type.

Figure 10:
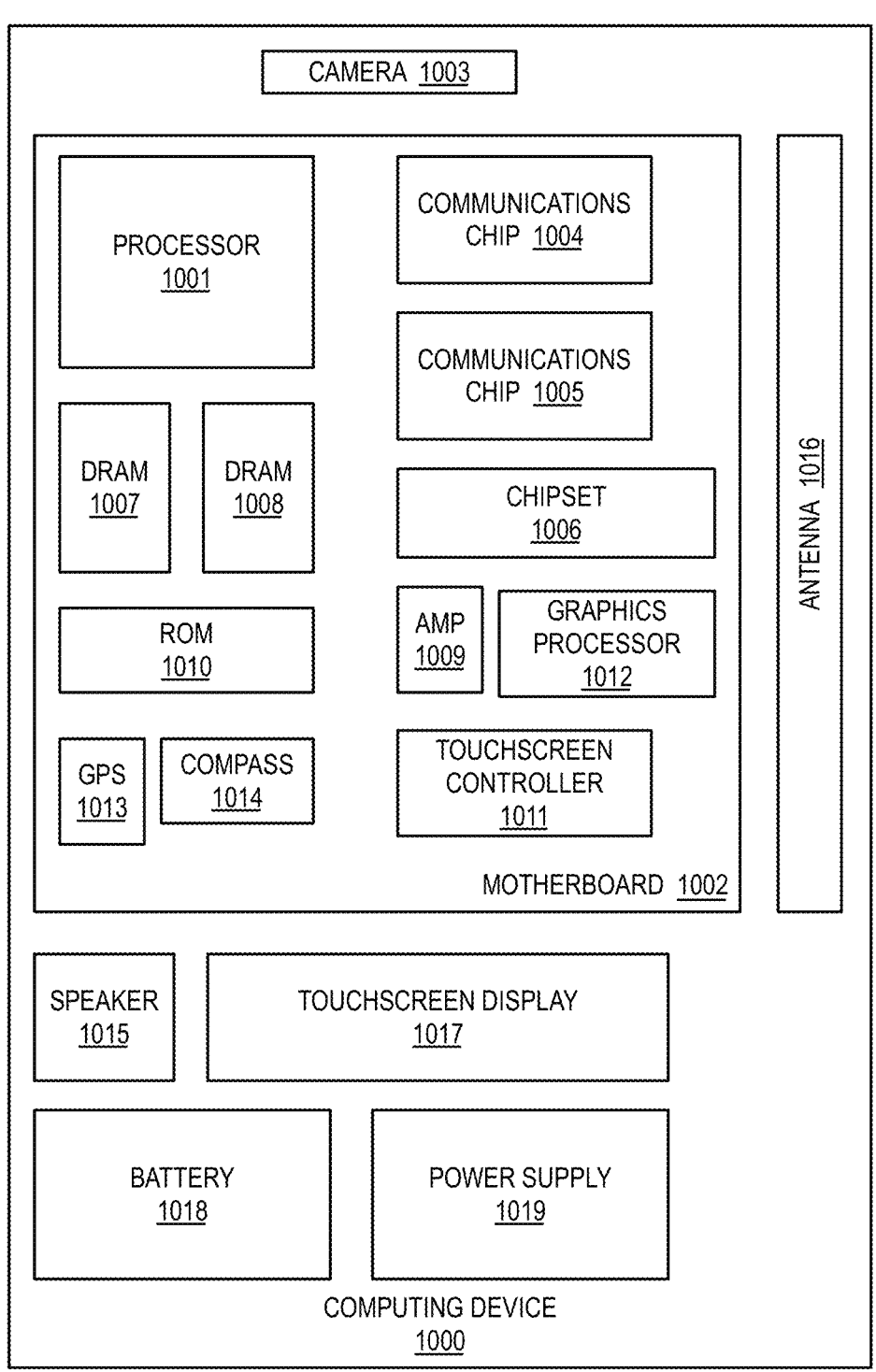
FIG. 10 is a functional block diagram of a computing device, all arranged in accordance with at least some implementations of the present disclosure.

FIG. 10 is a functional block diagram of a computing device 1000, arranged in accordance with at least some implementations of the present disclosure. Computing device 1000 includes a motherboard 1002 hosting a number of components, such as but not limited to a processor 1001 (e.g., an applications processor) and one or more communications chips 1004, 1005. Processor 1001 may be physically and/or electrically coupled to motherboard 1002. In some examples, processor 1001 includes an integrated circuit die packaged within processor 1001. In general, the term "processor" may refer to any device or portion of a device that processes electronic data from registers and/or memory to transform that electronic data into other electronic data that may be stored in registers and/or memory. Any operation discussed herein may be performed or controlled under instructions run by computing device 1000.

In various examples, one or more communication chips 1004, 1005 may also be physically and/or electrically coupled to the motherboard 1002. In further implementations, communication chips 1004 may be part of processor 1001. Depending on its applications, computing device 1000 may include other components that may or may not be physically and electrically coupled to motherboard 1002. These other components may include, but are not limited to, volatile memory (e.g., DRAM) 1007, 1008, non-volatile memory (e.g., ROM) 1010, a graphics processor 1012, flash memory, global positioning system (GPS) device 1013, compass 1014, a chipset 1006, an antenna 1016, a power amplifier 1009, a touchscreen controller 1011, a touchscreen display 1017, a speaker 1015, a camera 1003, a battery 1018, and a power supply 1019, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like.

Communication chips 1004, 1005 may enable wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chips 1004, 1005 may implement any of a number of wireless standards or protocols, including but not limited to those described elsewhere herein. As discussed, computing device 1000 may include a plurality of communication chips 1004, 1005. For example, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others. Furthermore, power supply 1019 may convert a source power from a source voltage to one or more voltages employed by other devices of computing device 1000. In some embodiments, power supply 1019 converts an AC power to DC power. In some embodiments, power supply 1019 converts an DC power to DC power at one or more different (lower) voltages. In some embodiments, multiple power supplies are staged to convert from AC to DC and then from DC at a higher voltage to DC at a lower voltage as specified by components of computing device 1000.

While certain features set forth herein have been described with reference to various implementations, this description is not intended to be construed in a limiting sense. Hence, various modifications of the implementations described herein, as well as other implementations, which are apparent to persons skilled in the art to which the present disclosure pertains are deemed to lie within the spirit and scope of the present disclosure.

The following embodiments pertain to further embodiments.

In one or more first embodiments, a system comprises a wafer stage to receive a wafer comprising at least one die and to position the die for testing, a probe to contact a first region of a first side of the die and to provide a test signal to the first region of the first side of the die, an electron-beam (e-beam) column to provide an e-beam to a second region of the first side of the die, a detector to detect an e-beam signal from the second region of the first side of the die, and a processor circuit to generate test data based on the e-beam signal.

In one or more second embodiments, further to the first embodiments, the probe comprises a probe card comprising a plurality of probe tips to contact pads of the first side of the die.

In one or more third embodiments, further to the first or second embodiments, the probe tips are adjacent a perimeter of the probe card and the probe card comprises a translucent or transparent region in an interior of the probe card at least partially surrounded by the perimeter.

In one or more fourth embodiments, further to the first through third embodiments, the translucent or transparent region comprises an open region of the interior of the probe card.

In one or more fifth embodiments, further to the first through fourth embodiments, the system further comprises a chamber and a vacuum pump to pull a vacuum in the chamber comprising the die during test, wherein at least portions of the wafer stage, the probe, and the e-beam column are within the chamber.

In one or more sixth embodiments, further to the first through fifth embodiments, the wafer stage is to position a second die of the wafer for testing while a continued vacuum is maintained during testing of the die and the second die.

In one or more seventh embodiments, further to the first through sixth embodiments, the probe is to provide a second test signal to the second die during testing of the second die, and wherein the test signal provides a first test type and the second test signal provides a second test type other than the first test type.

In one or more eighth embodiments, further to the first through seventh embodiments, the probe is to contact the first region of the die, the first region comprising a metallization layer of an integrated circuit, the metallization layer comprising one of a first or second metal layer directly over a transistor contact layer.

In one or more ninth embodiments, further to the first through eighth embodiments, the probe is to contact the first region of the die, the first region comprising a semiconductor material.

In one or more tenth embodiments, further to the first through ninth embodiments, the processor circuit is to perform, based on the test signal and the e-beam signal, at least one of e-beam signal image mapping, e-beam logic state imaging, optical-electrical fault mapping, e-beam device perturbation, or stroboscopic e-beam signal image mapping.

In one or more eleventh embodiments, a method comprises receiving a wafer comprising at least one die for testing, contacting a first region of a first side of the die, providing a test signal to the first region of the first side the die, emitting an electron-beam (e-beam) on a second region of the first side of the die, and receiving an e-beam signal from the second region of the first side of the die.

In one or more twelfth embodiments, further to the eleventh embodiments, contacting the first region comprises contacting the first region with a probe card, the probe card comprising a plurality of probe tips adjacent a perimeter of the probe card and a translucent or transparent region in an interior of the probe card at least partially surrounded by the perimeter.

In one or more thirteenth embodiments, further to the eleventh or twelfth embodiments, the method further comprises pulling a vacuum within a chamber comprising the wafer prior to said emitting the e-beam, positioning, during said pulling the vacuum, a second die of the wafer for testing, providing or receiving, during said pulling the vacuum, a second test signal to the second die, and emitting, during said pulling the vacuum and said providing the second test signal, a second e-beam on the second die.

In one or more fourteenth embodiments, further to the eleventh through thirteenth embodiments, the test signal provides a first test type and the second test signal provides a second test type other than the first test type.

In one or more fifteenth embodiments, further to the eleventh through fourteenth embodiments, the first region of the die comprises a metallization layer of an integrated circuit, the metallization layer comprising one of a first or second metal layer directly over a transistor contact layer of the integrated circuit.

In one or more sixteenth embodiments, further to the eleventh through fifteenth embodiments, the method further comprises performing, based on test data corresponding to the e-beam signal, at least one of e-beam signal image mapping, e-beam logic state imaging, optical-electrical fault mapping, e-beam device perturbation, or stroboscopic e-beam signal image mapping.

In one or more seventeenth embodiments, a method comprises pulling a vacuum in a chamber surrounding a wafer, the wafer comprising a plurality of dies for testing, positioning a first of the plurality of dies for testing of the first die, and during said pulling the vacuum in the chamber: providing a first test signal to a first region of a first side of the first die, attaining a first electron-beam (e-beam) signal from a second region of the first side of the first die during said providing the first test signal, positioning a second of the plurality of dies for testing of the second die, providing a second test signal to a first region of a first side of the second die, and attaining a second e-beam signal from a second region of the first side of the second die during said providing the second test signal.

In one or more eighteenth embodiments, further to the seventeenth embodiments, the first test signal provides a first test type and the second test signal provides a second test type other than the first test type.

In one or more nineteenth embodiments, further to the seventeenth or eighteenth embodiments, providing the first test signal to the first region comprises contacting the first region with a probe card.

In one or more twentieth embodiments, further to the seventeenth through nineteenth embodiments, the probe card comprises a plurality of probe tips adjacent a perimeter of the probe card and a translucent or transparent region in an interior of the probe card at least partially surrounded by the perimeter.

In one or more twenty-first embodiments, further to the seventeenth through twentieth embodiments, the first region of the die comprises a metallization layer of an integrated circuit, the metallization layer comprising one of a first or second metal layer directly over a transistor contact layer of the integrated circuit.

In one or more twenty-second embodiments, further to the seventeenth through twenty-first embodiments, the method further comprises performing, based on test data corresponding to the first or second e-beams, at least one of e-beam signal image mapping, e-beam logic state imaging, optical-electrical fault mapping, e-beam device perturbation, or stroboscopic e-beam signal image mapping.

It will be recognized that the invention is not limited to the embodiments so described, but can be practiced with modification and alteration without departing from the scope of the appended claims. For example, the above embodiments may include specific combination of features. However, the above embodiments are not limited in this regard and, in various implementations, the above embodiments may include the undertaking only a subset of such features, undertaking a different order of such features, undertaking a different combination of such features, and/or undertaking additional features than those features explicitly listed. The scope of the invention should, therefore, be determined with reference to the appended claims, along with the full scope of equivalents to which such claims are entitled.

What is claimed is:

1. A system, comprising:
a wafer stage to receive a wafer comprising at least one die and to position the die for testing;
a probe to contact a first region of a first side of the die and to provide a test signal to the first region of the first side of the die, wherein the probe comprises a probe card comprising a plurality of probe tips to contact pads of the first side of the die, and wherein the probe tips are adjacent a perimeter of the probe card and the probe card comprises a translucent or transparent region in an interior of the probe card at least partially surrounded by the perimeter;
an electron-beam (e-beam) column to provide an e-beam to a second region of the first side of the die;
a detector to detect an e-beam signal from the second region of the first side of the die; and
a processor circuit to generate test data based on the e-beam signal.

2. The system of claim 1, wherein the translucent or transparent region comprises an open region of the interior of the probe card.

3. The system of claim 1, further comprising:
a chamber and a vacuum pump to pull a vacuum in the chamber comprising the die during test, wherein at least portions of the wafer stage, the probe, and the e-beam column are within the chamber.

4. The system of claim 3, wherein the wafer stage is to position a second die of the wafer for testing while a continued vacuum is maintained during testing of the die and the second die.

5. The system of claim 4, wherein the probe is to provide a second test signal to the second die during testing of the second die, and wherein the test signal provides a first test type and the second test signal provides a second test type other than the first test type.

6. The system of claim 1, wherein the first region comprises a semiconductor material or the first region comprises a metallization layer of an integrated circuit, the metallization layer comprising one of a first or second metal layer directly over a transistor contact layer.

7. The system of claim 1, wherein the processor circuit is to perform, based on the test signal and the e-beam signal, at least one of e-beam signal image mapping, e-beam logic state imaging, optical-electrical fault mapping, e-beam device perturbation, or stroboscopic e-beam signal image mapping.

8. A method, comprising:
receiving a wafer comprising at least one die for testing;
contacting a first region of a first side of the die, wherein contacting the first region comprises contacting the first region with a probe card, the probe card comprising a plurality of probe tips adjacent a perimeter of the probe card and a translucent or transparent region in an interior of the probe card at least partially surrounded by the perimeter;
providing a test signal to the first region of the first side the die;
emitting an electron-beam (e-beam) on a second region of the first side of the die; and
receiving an e-beam signal from the second region of the first side of the die.

9. The method of claim 8, further comprising:
pulling a vacuum within a chamber comprising the wafer prior to said emitting the e-beam;
positioning, during said pulling the vacuum, a second die of the wafer for testing;
providing or receiving, during said pulling the vacuum, a second test signal to the second die; and
emitting, during said pulling the vacuum and said providing the second test signal, a second e-beam on the second die.

10. The method of claim 9, wherein the test signal provides a first test type and the second test signal provides a second test type other than the first test type.

11. The method of claim 8, wherein the first region of the die comprises a metallization layer of an integrated circuit, the metallization layer comprising one of a first or second metal layer directly over a transistor contact layer of the integrated circuit.

12. The method of claim 8, further comprising:
performing, based on test data corresponding to the e-beam signal, at least one of e-beam signal image mapping, e-beam logic state imaging, optical-electrical fault mapping, e-beam device perturbation, or stroboscopic e-beam signal image mapping.

13. A method, comprising:
pulling a vacuum in a chamber surrounding a wafer, the wafer comprising a plurality of dies for testing;
positioning a first of the plurality of dies for testing of the first die; and
during said pulling the vacuum in the chamber:
providing a first test signal to a first region of a first side of the first die;
attaining a first electron-beam (e-beam) signal from a second region of the first side of the first die during said providing the first test signal;
positioning a second of the plurality of dies for testing of the second die;
providing a second test signal to a first region of a first side of the second die; and

21 attaining a second e-beam signal from a second region of the first side of the second die during said providing the second test signal.

14. The method of claim 13, wherein the first test signal provides a first test type and the second test signal provides a second test type other than the first test type.

15. The method of claim 13, wherein providing the first test signal to the first region comprises contacting the first region with a probe card.

16. The method of claim 15, wherein the probe card comprises a plurality of probe tips adjacent a perimeter of the probe card and a translucent or transparent region in an interior of the probe card at least partially surrounded by the perimeter.

17. The method of claim 13, wherein the first region of the first die comprises a metallization layer of an integrated circuit, the metallization layer comprising one of a first or second metal layer directly over a transistor contact layer of the integrated circuit.

18. The method of claim 13, further comprising:

performing, based on test data corresponding to the first or second e-beams, at least one of e-beam signal image mapping, e-beam logic state imaging, optical-electrical fault mapping, e-beam device perturbation, or stroboscopic e-beam signal image mapping.

19. A system, comprising:

a wafer stage to receive a wafer comprising a first die and a second die, and to position the first die for testing;

a probe to contact a first region of a first side of the first die and to provide a test signal to the first region of the first side of the first die;

an electron-beam (e-beam) column to provide an e-beam to a second region of the first side of the first die;

a detector to detect an e-beam signal from the second region of the first side of the first die;

a chamber and a vacuum pump to pull a vacuum in the chamber comprising the first die during test, wherein at least portions of the wafer stage, the probe, and the e-beam column are within the chamber, and wherein the wafer stage is to position the second die of the wafer for testing while a continued vacuum is maintained during testing of the first die and the second die; and a processor circuit to generate test data based on the e-beam signal.

20. The system of claim 19, wherein the probe comprises a probe card comprising a plurality of probe tips to contact pads of the first side of the first die.

21. The system of claim 19, wherein the probe is to provide a second test signal to the second die during testing of the second die, and wherein the test signal provides a first test type and the second test signal provides a second test type other than the first test type.

22. The system of claim 19, wherein the first region comprises a semiconductor material or the first region comprises a metallization layer of an integrated circuit, the metallization layer comprising one of a first or second metal layer directly over a transistor contact layer.

23. The system of claim 19, wherein the processor circuit is to perform, based on the test signal and the e-beam signal, at least one of e-beam signal image mapping, e-beam logic state imaging, optical-electrical fault mapping, e-beam device perturbation, or stroboscopic e-beam signal image mapping.

* * * * *